United States Patent [19]

Hayakawa

[11] Patent Number: 5,789,789
[45] Date of Patent: Aug. 4, 1998

[54] SEMICONDUCTOR DEVICE AND MANUFACTURING METHOD FOR IMPROVED VOLTAGE RESISTANCE BETWEEN AN N-WELL AND N-TYPE DIFFUSION LAYER

[75] Inventor: Tsutomu Hayakawa, Tokyo, Japan

[73] Assignee: NEC Corporation, Tokyo, Japan

[21] Appl. No.: 718,266

[22] Filed: Sep. 20, 1996

[30] Foreign Application Priority Data

Sep. 20, 1995 [JP] Japan ..................... 7-242176

[51] Int. Cl.$^6$ ..................... H01L 29/76
[52] U.S. Cl. ............ 257/376; 257/399; 257/400; 257/509
[58] Field of Search .................. 257/345, 354, 257/376, 399, 400, 497, 498, 499, 509, 519, 371

[56] References Cited

U.S. PATENT DOCUMENTS 5,359,221  10/1994  Miyamoto et al. ............... 257/408

OTHER PUBLICATIONS

Toshiyuki Nishihara et al, A 0.5μm Isolation Technology Using Advanced Poly Silicon Pad LOCOS (APPL), 1988, IEEE, pp. 100–103.

*Primary Examiner*—Minh-Loan Tran
*Attorney, Agent, or Firm*—Sughrue, Mion, Zinn, Macpeak & Seas, PLLC

[57] ABSTRACT

A manufacturing method for a semiconductor device is disclosed for effecting improvement of voltage resistance between an N-well and N-type diffusion layer without adversely affecting circuit and transistor characteristics. At the time of forming an N-well, a side wall composed of nitride layer is formed on the oxide layer that is used as a mask in phosphorus implantation, and the N-well is formed using as a mask the oxide layer on which this side wall is provided. The side wall is then removed, boron is implanted, and a channel stopper is formed only between the N-well and N-type diffusion layer. A channel stopper between N-type diffusion layers is formed subsequently as a separate step. In this way, the concentration of the channel stopper between the N-well and N-type diffusion can be set to a concentration different from that of the channel stopper between N-type diffusion layers.

4 Claims, 6 Drawing Sheets

SEMICONDUCTOR DEVICE AND MANUFACTURING METHOD FOR IMPROVED VOLTAGE RESISTANCE BETWEEN AN N-WELL AND N-TYPE DIFFUSION LAYER

BACKGROUND OF THE INVENTION

1. Field of the Invention

The present invention relates to the structure and manufacturing method of a semiconductor device, and particularly to the configuration and manufacturing method for isolation including PN separation in a semiconductor device of CMOS structure.

2. Description of the Related Art

Double-application methods, in which photolithographic processes are carried out twice, are manufacturing methods for element separation including PN separation that are known in the art, and such a double-application method can be explained with reference to FIGS. 1(a)–(e).

A first oxide layer 2 is grown to 500 nm on a P-type silicon substrate 1 having an impurity concentration of $1 \times 10^{16}$ cm$^3$, following which the oxide layer is removed from the area which is to become an N-well using a photolithographic process. Phosphorus is then injected by an ion implantation method into the portions from which the oxide layer has been removed, and a second 300-nm thick oxide layer 3 and N-well 5 are then formed through thermal diffusion and heat oxidation (Refer to FIG. 1(a)).

First and second oxide layers 2, 3 are then removed, a third oxide layer 7 is formed to 40 nm, a nitride layer 8 is formed to 120 nm, and a photoresist 9 of a prescribed pattern is formed using a photolithographic process in the areas that are to become active areas. Using photoresist 9 as a mask, nitride layer 8 is removed from portions not covered by this mask (Refer to FIG. 1(b)).

With photoresist 9 still intact, photoresist 10 is then formed over N-well 5, again using a photolithographic process. Photoresists 9 and 10 are then used as masks for ion implantation of boron, and an area 11 (hereinbelow referred to as a "channel stopper") having a higher concentration of impurities than that of P-type silicon substrate 1 is formed to prevent parasitic transistors (Refer to FIG. 1(c)).

Next, photoresists 9 and 10 are removed, P-type silicon substrate 1 is oxidized and LOCOS (local oxidation of silicon) oxide layer 12 is formed to 600 nm to isolation. Nitride layer 8 is next removed, and N-well 5 is covered by photoresist 13 using a photolithographic process in order to perform ion implantation for transistor VT regulation (refer to FIG. 1(d)). Using this photoresist 13 as a mask, boron or phosphorus is implanted for VT regulation of transistors by an ion implantation method, and a transistor of the structure shown in FIG. 1(e) is obtained using techniques known in the art.

In recent years, however, in the interest of reducing the number of manufacturing processes, the mainstream method has become a manufacturing method (LOCOS oxide layer through method) in which the photolithographic process for forming channel stoppers and the photolithographic process for VT regulation of transistors are combined into one process, the channel stopper being formed by ion implantation through the LOCOS oxide layer. This manufacturing method is explained hereinbelow in terms of the actual manufacturing processes as shown in FIG. 2(a)–(c).

An N-well 5 is formed using a process equivalent to the above-described processes of FIG. 1(a) and (b), and patterning is performed to leave a nitride layer in the active areas (refer to FIG. 2(a)).

Photoresist 9 is next removed. P-type silicon substrate 1 is oxidized, and LOCOS oxide layer 12 is formed to 600 nm. Nitride layer 8 is then removed and, for VT regulation of transistors, N-well 5 is covered by photoresist 13 using a photolithographic process, and a channel stopper 11 is formed under LOCOS oxide layer 12 by ion implantation of boron at 180 KeV (refer to FIG. 2(b)). Using this photoresist 13 as a mask, ion implantation of boron is performed at 30 KeV for VT regulation of transistors, and a transistor of the structure shown in FIG. 2(c) is obtained using techniques known in the art.

By means of the above-described LOCOS oxide layer through method, ion implantation for VT regulation of transistors and ion implantation for a channel stopper can both be performed in a single photolithographic process, and the method therefore allows the omission of one photolithographic step as compared with the previously described manufacturing process shown in FIG. 1.

In recent years, however, higher concentrations of impurity in wells have become necessary to prevent decreases in transistor voltage resistance (BVDS) that accompany the increasing miniaturization of element dimensions, the trend toward higher concentrations in N-wells being particularly advanced.

In designing for high-concentration wells, a drop in voltage resistance between, for example, an N+ diffusion layer within a P-well and an N-well results in insufficient current, and this calls for a higher concentration in the channel stopper between the N-well and N+-diffusion layer as a countermeasure. In the channel stopper formation methods of the prior art as described hereinabove with respect to FIG. 1 and FIG. 2, however, a channel stopper between the N+ diffusion layers within a P-well is formed simultaneously with a channel stopper between the N-well and N+ diffusion layer, and as a result, if a higher concentration in the channel stopper between the N-well and N+ diffusion layer is attempted, the channel stopper between the N+ diffusion layers within the P-well will also be of higher concentration, thereby leading to such problems as degradation of circuit characteristics due to, for example, an increase in diffusion layer lateral capacity. The problem therefore exists that a sufficiently high concentration of the channel stopper cannot be achieved.

FIG. 3 shows the relation between channel stopper concentration and diffusion layer lateral capacity, and FIG. 4 shows the relation between channel stopper concentration and the voltage resistance between an N-type diffusion layer and an N-well as well as N-well concentration. As can be easily seen from FIG. 3 and FIG. 4, the channel stopper concentration must be reduced to suppress diffusion layer lateral capacity, while the channel stopper concentration must be increased to improve voltage resistance between the N-type diffusion layer and N-well. In addition to the above-described problem, when using the current mainstream field-through method, the channel stopper extends below active areas, and this factor adversely affects transistor characteristics and circuit characteristics such as diffusion layer base capacity or the substrate potential dependence of transistor VT. The relationship between this type of adverse influence and the impurity concentration of the channel stopper is shown in FIG. 5. FIG. 5 is a characteristics chart showing the relation between N-type diffusion layer base capacity and channel stopper concentration, and in the chart, prior-art example 1 relates to the above-described manufacturing method shown in FIG. 1 and prior-art example 2 relates to the above-described manufacturing method shown in FIG. 2.

SUMMARY OF THE INVENTION

The object of the present invention is to provide a semiconductor device and corresponding manufacturing method that solve the above-described problems, and moreover, that enable improvement of voltage resistance between an N-well and N-type diffusion layer without adversely influencing circuit characteristics or transistor characteristics.

To achieve the above-described objects, a semiconductor device according to the present invention is a semiconductor device having a semiconductor substrate and areas of impurities, the semiconductor substrate both has adjacent first and second conductivity-type areas of differing conductivity and is provided with a LOCOS oxide layer and an active area, the first conductivity-type area has a second conductivity-type diffusion layer of conductivity differing from that of that area, the second conductivity-type area has a first conductivity-type diffusion layer of conductivity differing from that of that area, the area of impurities has first and second impurity areas having differing impurity concentrations, the first impurity area is formed in a layer underlying the LOCOS oxide layer located at the border between the first conductivity-type area and second conductivity-type area, and the second impurity area is formed in a layer underlying the LOCOS oxide layer located between the second conductivity-type diffusion layers.

In the above-described case, the active area may include a gate electrode with an interposed gate oxide layer.

In addition, the concentrations of impurities in the first impurity area and the second impurity area may be greater than that of the first conductivity-type area.

Further, the first impurity area and the second impurity area may constitute channel stoppers.

To achieve the above-described objects, a manufacturing method of a semiconductor device according to the present invention includes:

a side-wall forming step in which a first oxide layer is formed in a first conductivity-type area of a semiconductor substrate and a side wall is formed only on the side surface of the oxide layer;

an oxide layer forming step in which a second oxide layer is formed in a second conductivity-type area of the semiconductor substrate using the first oxide layer and the side wall as a mask;

a trench forming step in which the side wall is selectively removed, and a trench is formed at the border of the first conductivity-type area and the second conductivity-type area; and an impurity implantation step in which first conductivity-type impurities are ion implanted into the trench using the oxide layer as a mask.

According to the present invention as described hereinabove, the semiconductor device may be constructed such that impurity concentrations for the first impurity area formed in the lower layer of the LOCOS oxide layer located at the border between first conductivity-type area and the second conductivity-type area and the second impurity area formed in the lower layer of the LOCOS oxide area located between the second conductivity-type diffusion layers may be set to different levels. Accordingly, impurity concentrations can be individually set for a channel stopper for prevention of parasitic transistors between a diffusion layer and well of the same conductivity type (in concrete terms, N-type if the semiconductor substrate is P-type) and a channel stopper for prevention of parasitic transistors between diffusion layers of the same conductivity type (in concrete terms, N-type when the semiconductor substrate is P-type). In concrete terms, a channel stopper between N+ diffusion layers within a P-well and a channel stopper between an N-well and N+ diffusion layer can be formed with differing impurity concentrations in separate processes.

As explained hereinabove, in the present invention, because impurity concentrations can be individually set for a channel stopper for prevention of parasitic transistors between a diffusion layer and well of the same conductivity type (in concrete terms, N-type when the semiconductor substrate is P-type) and for a channel stopper for prevention of parasitic transistors between diffusion layers of the same conductivity type (in concrete terms, N-type when the semiconductor substrate is P-type), the impurity concentrations of the channel stoppers can be set to obtain sufficient voltage resistance between diffusion layers and wells with respect to wells with higher impurity concentrations without adversely influencing either transistor characteristics or circuit characteristics, thereby enabling improved voltage resistance without degrading circuit characteristics.

Furthermore, impurity concentrations can be set without need for additional photolithographic processes, thereby limiting increases in manufacturing costs.

The above and other objects, features, and advantages of the present invention will become apparent from the following description based on the accompanying drawings which illustrate examples of preferred embodiments of the present invention.

DETAILED DESCRIPTION OF THE PREFERRED EMBODIMENTS

The present invention will next be explained with reference to the accompanying figures.

Figure 6:
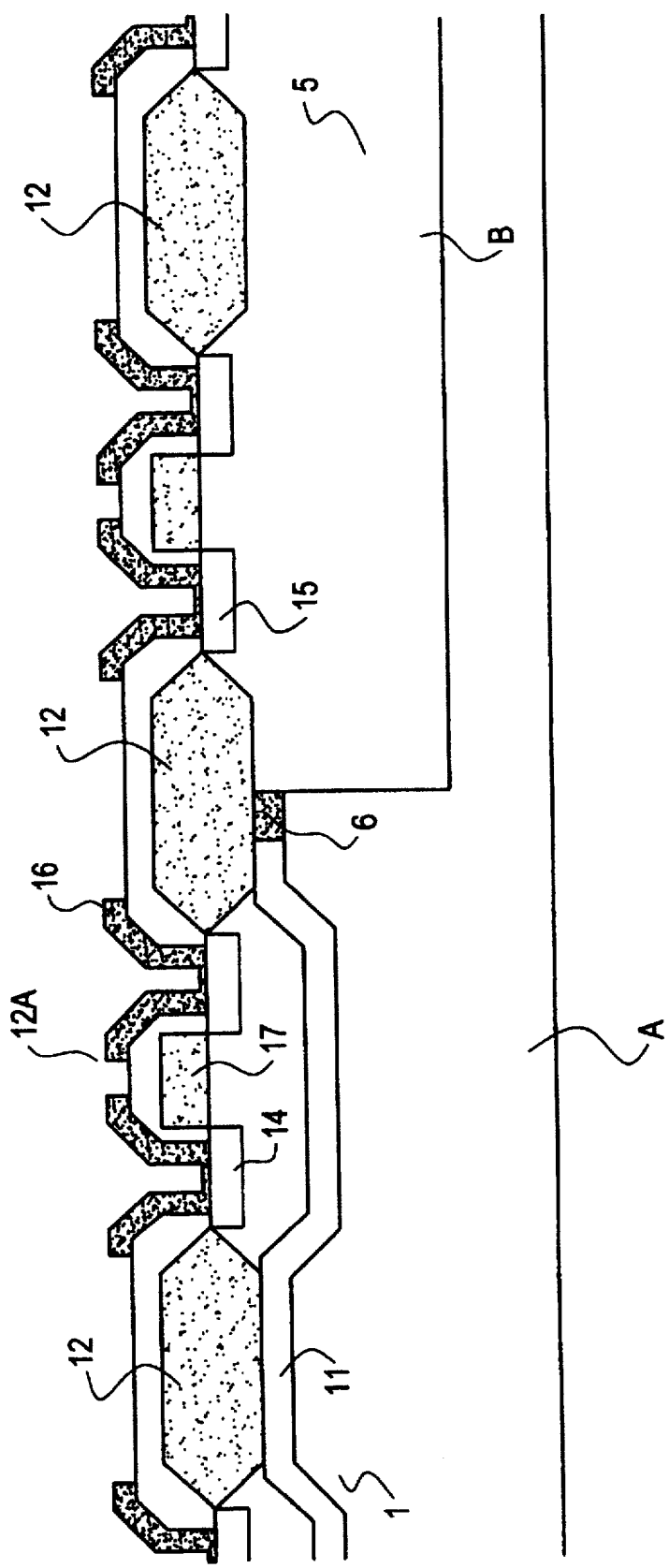
FIG. 6 is a sectional view of one embodiment of a semiconductor chip of the present invention.

FIG. 6 is a sectional view of one embodiment of a semiconductor chip of the present invention. In FIG. 6, semiconductor substrate (P-type semiconductor substrate 1) has areas A and B of differing conductivity types, first conductivity type and second conductivity type, provided adjacent to each other; and on the substrate are provided LOCOS oxide layer 12, which is an isolation area, and active area 12a, which is an element formation area.

Gate electrode 17 is formed on active area 12a with an interposed gate oxide layer. Second conductivity-type diffusion layer (N-type diffusion layer 14), which is of different conductivity type than area A, is provided between LOCOS oxide layer 12 and gate electrode 17 within first conductivity-type area A and below active area 12a. First conductivity-type diffusion layer (P-type diffusion layer 15), which is of different conductivity type than area B, is provided between LOCOS oxide layer 12 and gate electrode 17 within second conductivity-type area B (N-well 5) and below active area 12a. Wiring 16 is formed on each of the first conductivity type diffusion layer and the second conductivity-type diffusion layer.

A first impurity area 6 (channel stopper between N+ diffusion layer and N-well) is formed below LOCOS oxide layer 12 located at the border of first conductivity-type area A and second conductivity-type area B, and a second impurity area 11 (channel stopper between N-type diffusion layers) is formed below LOCOS oxide layer 12 provided between second conductivity-type diffusion layers (N-type diffusion layers 14) of first conductivity-type area A. First and second impurity areas 6 and 11 have differing impurity concentrations.

The impurity concentrations of first impurity area 6 and second impurity area 11 are greater than that of first conductivity-type area A. Here, first impurity area 6 is a channel stopper for prevention of parasitic transistors between the N-type diffusion layer and N-well, and second impurity area 11 is a channel stopper for prevention of parasitic transistors between the N-type diffusion layers.

The manufacturing process for one embodiment of the present invention having the above-described chip configuration will next be explained in concrete terms with reference to FIG. 7.

Figure 7A:
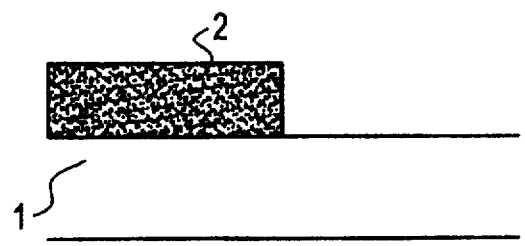
FIGS. 7(a)–7(e) are sectional views showing the manufacturing stages of one embodiment of the present invention.
Figure 7B:
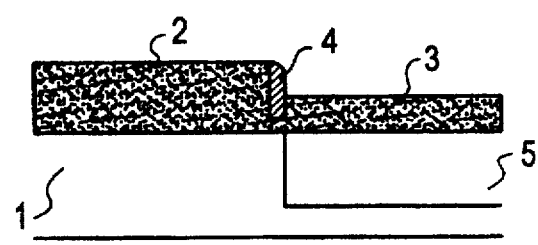
Figure 7C:
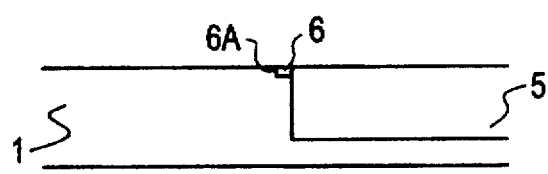

As shown in FIG. 7(a), first oxide layer 2 is grown to 500 nm on first conductivity-type area A of P-type silicon substrate 1 having a B concentration of $1\times10^{16}$ cm$^3$ and, using a photolithographic process, first oxide layer 2 is then removed by etching from the area which is to become the N-well (second conductivity-type area B).

A 500-nm nitride layer is then deposited over the entire surface of substrate 1, and a side wall 4 composed of nitride layer is formed on the side surface of first oxide layer 2 on first conductivity-type area A by carrying out anisotropic etching. Using first oxide layer 2 and side wall 4 as a mask, phosphorus is then implanted using an ion implantation method, and thermal diffusion including oxidation is carried out to form N-well 5 (second conductivity-type area B) and second oxide layer 3 (refer to FIG. 7(b)).

Side wall 4 is then removed, a trench depression 6a is formed at the boundary between N-well 5 and P-type semiconductor substrate 1, and ion implantation is performed to implant boron into trench 6a at an energy level such that ions are implanted only within this trench 6a, thereby forming channel stopper 6 between the N-well and N-type diffusion layer. Oxide layers 2 and 3 are subsequently removed (refer to FIG. 7(c)).

Figure 1A:
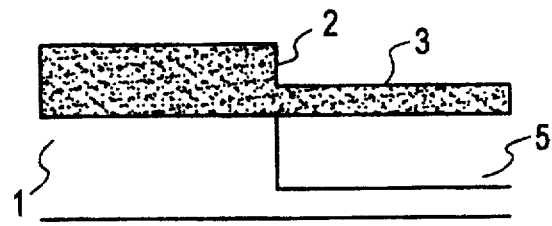
FIGS. 1(a)–1(e) are sectional views showing the manufacturing stages according to the double-application method of the prior art.
Figure 1B:
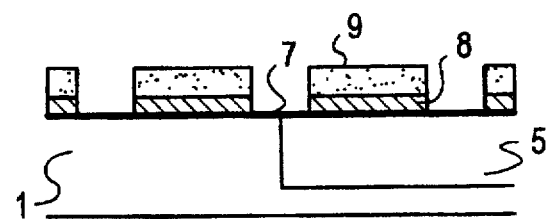
Figure 1C:
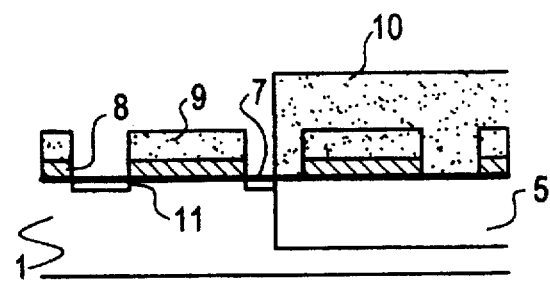
Figure 1D:
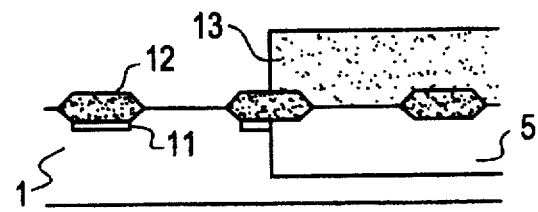
Figure 1E:
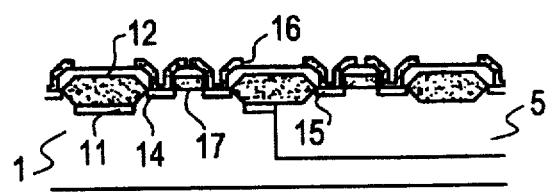
Figure 2A:
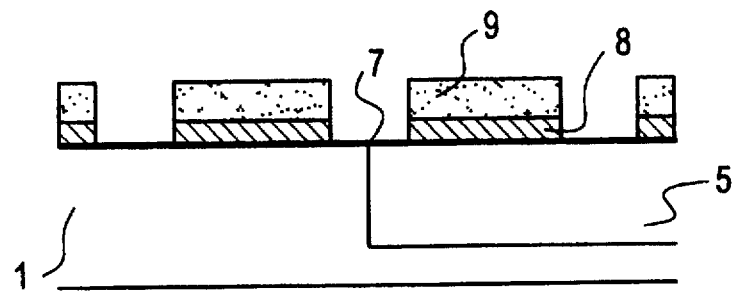
FIGS. 2(a)–2(c) are sectional views showing the manufacturing stages according to the LOCOS oxide layer-through method of the prior art.
Figure 2B:
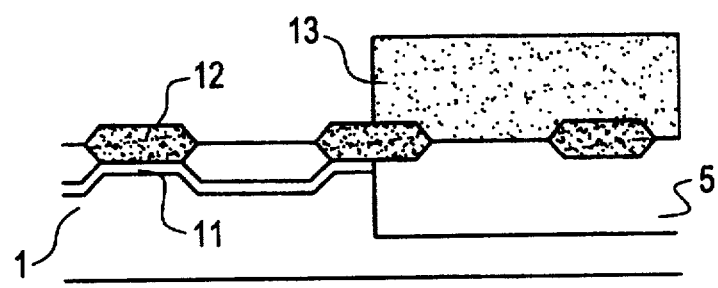
Figure 2C:
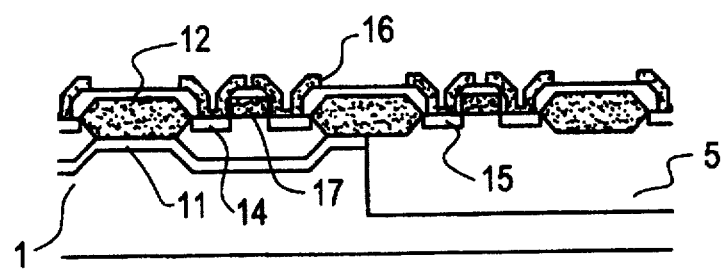
Figure 3:
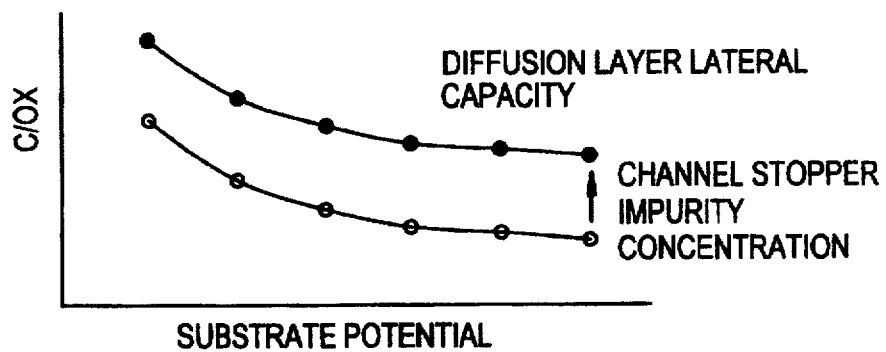
FIG. 3 is a characteristics chart showing the relation between channel stopper concentration and diffusion layer lateral capacity.
Figure 4:
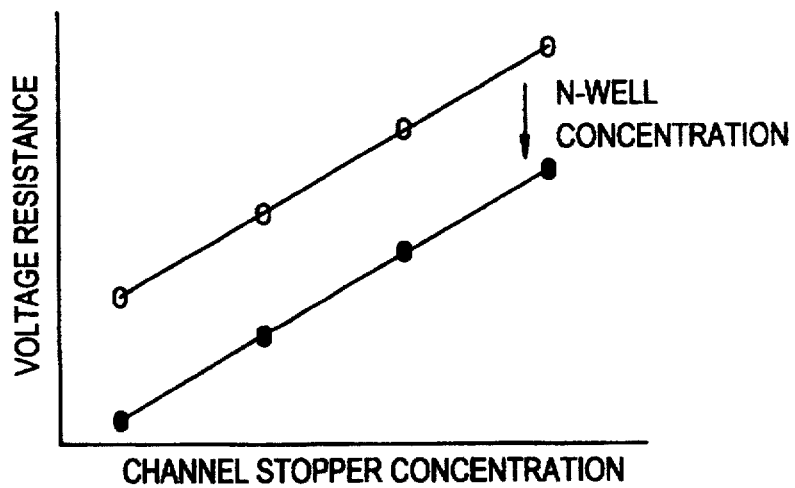
FIG. 4 is a characteristics chart showing the relation between channel stopper concentration, voltage resistance between an N-type diffusion layer and N-well, and N-well concentration.
Figure 5:
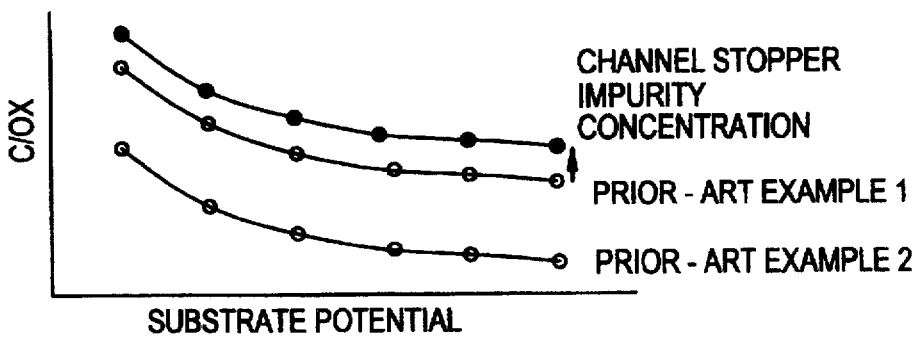
FIG. 5 is a characteristics chart showing the relation between N-type diffusion layer base surface capacity and channel stopper concentration.
Figure 7D:
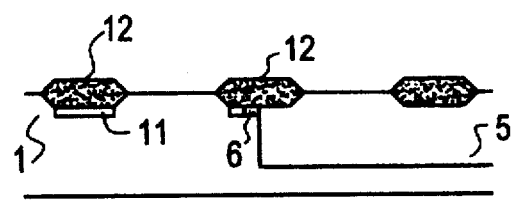
Figure 7E:
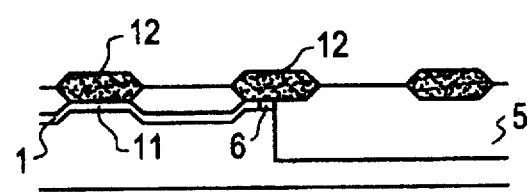

Next, LOCOS oxide layer 12 and channel stopper 11 between N-type diffusion layers are formed using, for example, a known LOCOS method, a field-through method, or a double-application method (refer to FIG. 7(d)(e)). FIG. 7(d) shows a case in which channel stopper 11 is formed using the double-application method shown in FIG. 1, and FIG. 7(e) shows a case in which channel stopper 11 is formed using the LOCOS oxide layer through method shown in FIG. 2. In either of the cases shown in (d) and (e) of FIG. 7, channel stopper 11 and channel stopper 6 are formed in different processes, and as a result, channel stopper 11 can be formed with a different concentration from that of channel stopper 6 which is formed between the N-well and N-type diffusion layer at the time of formation of N-well 5.

FIG. 8 is a sectional view showing the manufacturing stages of another embodiment of the present invention. Although oxidation and thermal diffusion were carried out in the same step in the embodiment described hereinabove, in this embodiment, oxidation and thermal diffusion are carried out in separate steps. A concrete example of this manufacturing process will next be described.

Figure 8A:
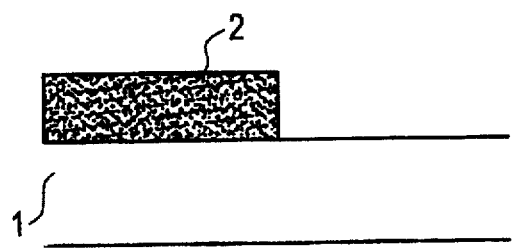
FIGS. 8(a)–8(e) are sectional views showing the manufacturing stages of another embodiment of the present invention.
Figure 8B:
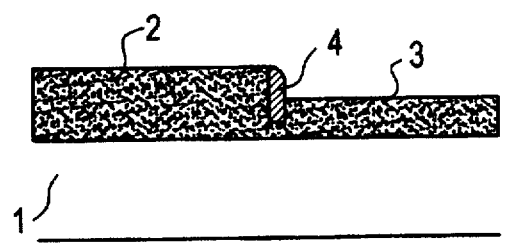
Figure 8C:
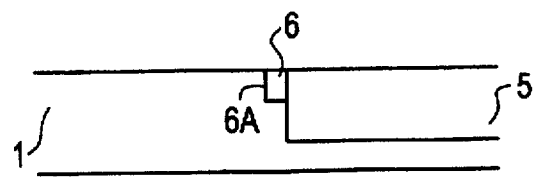

As shown in FIG. 8(a), a first oxide layer 2 is grown to 500 nm on first conductivity-type area A of P-type silicon substrate 1 having a B concentration of $1\times10^{16}$ cm$^3$, and using a photolithographic process, the first oxide layer is removed by etching from the area which is to become the N-well (second conductivity-type area B).

Next, a 500-nm nitride layer is deposited over the entire surface, anisotropic etching is carried out, and side wall 4 composed of the nitride layer is formed on the side wall of first oxide layer 2. Using first oxide layer 2 and side wall 4 as a mask, P-type semiconductor substrate 1 is oxidized and second oxide layer 3 is formed to 200 nm on the area that is to become the N-well (refer to FIG. 8(b)).

Using first oxide layer 2 and side wall 4 as a mask, ion implantation is carried out at an energy level such that phosphorus is implanted by an ion implantation method directly below second oxide layer 3. Side wall 4 is then removed, trench 6a is formed directly below the position where side wall 4 was located, and ion implantation of boron is carried out at an energy level such that boron is implanted only into trench 6a for forming a channel stopper 6 between the N-well and N-type diffusion layer, and N-well 5 and channel stopper 6 are formed through thermal diffusion. Oxide layers 2 and 3 are subsequently removed (refer to FIG. 8 (c)).

Figure 8D:
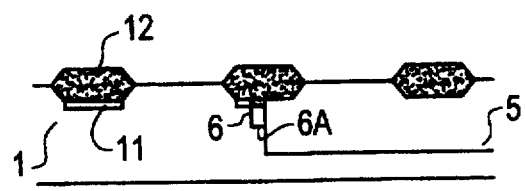
Figure 8E:
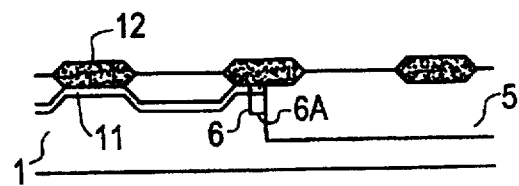

Next, as for the first embodiment described hereinabove, LOCOS oxide layer 12 and channel stopper 11 between N-type diffusion layers are formed using a known LOCOS method, LOCOS oxide layer through method, or double-application method (refer to FIG. 8(d) and (e)). FIG. 8(d) shows a case in which the channel stopper is formed using the double-application method, and FIG. 8(e) shows a case in which the LOCOS oxide layer through method is used.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A semiconductor device comprising:
    a semiconductor substrate including adjacent first and second conductivity-type areas of differing conductivity;
    a plurality of second conductivity-type diffusion layers disposed on said first conductivity-type area, said second conductivity-type diffusion layers having a conductivity differing from that of said first conductivity-type area;

a plurality of first conductivity-type diffusion layers disposed on said second conductivity-type area, said first conductivity type diffusion layers having a conductivity differing from that of said second conductivity-type area;

a plurality of LOCOS oxide layers and active areas, each disposed on said substrate; and an area of impurities including first and second impurity areas having differing impurity concentrations, said first impurity area being located at the border between said first conductivity-type area and said second conductivity-type area in a layer directly underlying one of said LOCOS oxide layers to form a channel stopper between said second conductivity-type area and one of said second conductivity-type diffusion layers, and said second impurity area being located between said second conductivity-type diffusion layers in a layer directly underlying one of said LOCOS oxide layers to form a channel stopper between said second conductivity-type diffusion layers.

2. A semiconductor device according to claim 1 wherein said active area has a gate electrode with an interposed gate oxide layer.

3. A semiconductor device according to claim 1 wherein the concentrations of impurities in said first impurity area and said second impurity area are greater than that of said first conductivity-type area.

4. A semiconductor device according to claim 1, wherein said second conductivity-type area is an N-well.

* * * * *